(12) United States Patent
Nam et al.

(10) Patent No.: US 8,957,408 B2
(45) Date of Patent: Feb. 17, 2015

(54) ORGANIC LIGHT EMITTING DEVICE AND METHOD FOR MANUFACTURING THE SAME

(71) Applicant: LG Display Co., Ltd., Seoul (KR)

(72) Inventors: Dong-Hee Nam, Gyeonggi-do (KR); Young-Gu Lee, Gyeonggi-do (KR); Hee-Jin Kim, Gyeonggi-do (KR); Hak-Min Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 69 days.

(21) Appl. No.: 13/689,961

(22) Filed: Nov. 30, 2012

(65) Prior Publication Data
US 2013/0168652 A1 Jul. 4, 2013

(30) Foreign Application Priority Data
Dec. 30, 2011 (KR) ........................ 10-2011-0146883

(51) Int. Cl.
| | | |
|---|---|---|
| H01L 29/08 | (2006.01) |
| H01L 35/24 | (2006.01) |
| H01L 21/00 | (2006.01) |
| H01L 51/50 | (2006.01) |
| H01L 51/00 | (2006.01) |
| H01L 27/32 | (2006.01) |

(52) U.S. Cl.
CPC ............ *H01L 51/50* (2013.01); *H01L 51/0002* (2013.01); *H01L 51/504* (2013.01); *H01L 27/3211* (2013.01); *H01L 51/0003* (2013.01); *H01L 51/0008* (2013.01); *H01L 51/5004* (2013.01)
USPC .............................................. 257/40; 438/35

(58) Field of Classification Search
CPC .................................................... H01L 51/0002
USPC ............................................................ 257/35
See application file for complete search history.

(56) References Cited

U.S. PATENT DOCUMENTS

| | | | | |
|---|---|---|---|---|
| 5,703,436 A | * | 12/1997 | Forrest et al. | 313/506 |
| 7,615,790 B2 | * | 11/2009 | Lee | 257/79 |
| 8,410,683 B2 | * | 4/2013 | Song et al. | 313/504 |
| 2007/0075310 A1 | * | 4/2007 | Lee | 257/40 |

* cited by examiner

*Primary Examiner* — Lex Malsawma
(74) *Attorney, Agent, or Firm* — Morgan, Lewis & Bockius LLP

(57) ABSTRACT

An organic light emitting device, efficacy and lifetime of which are improved by forming a blue light emitting layer disposed over respective pixels in common as a double layer structure, includes a substrate divided into and defined by first to third pixels, a first electrode disposed on the TFT substrate and a second electrode facing the first electrode, the second electrode being spaced from the first electrode, a first light emitting layer and a second light emitting layer disposed in the first pixel and in the second pixel, respectively, between the first electrode and the second electrode, a sub-light emitting layer and a third light emitting layer disposed over the first to third pixels in this order on the first light emitting layer and the second light emitting layer.

18 Claims, 5 Drawing Sheets

FIG. 6

| Ref. | PEDOT 40nm | HT-601 20nm | Red (50nm) | ETL 20nm | LiF/Al 0.5/100nm |

| Red 1. | PEDOT 40nm | HT-601 20nm | Red (50nm) | Blue (5.2%) 30nm | ETL 20nm | LiF/Al 0.5nm/100nm |

| Red 2. | PEDOT 40nm | HT-601 20nm | Red (50nm) | Blue (0.4%) 5nm | Blue (5.2%) 25nm | ETL 20nm | LiF/Al 0.5nm/100nm |

FIG. 7

| Ref. | PEDOT 40nm | HT-601 20nm | Green (40nm) | ETL 20nm | LiF/Al 0.5/100nm |

| Green 1. | PEDOT 40nm | HT-601 20nm | Green (40nm) | Blue (5.2%) 30nm | ETL (LGD) 20nm | LiF/Al 0.5nm/100nm |

| Green 2. | PEDOT 40nm | HT-601 20nm | Green (40nm) | Blue (0.4%) 5nm | Blue (5.2%) 25nm | ETL (LGD) 20nm | LiF/Al 0.5nm/100nm |

FIG. 8

| Ref (Soluble +Evap) | PEDOT 40nm | HT-S01 20nm | Blue (5.2%) 25nm | | ETL (LGD) 20nm | LiF/Al 0.5nm/100nm |
|---|---|---|---|---|---|---|
| Blue 1 (Soluble +Evap) | PEDOT 40nm | HT-S01 20nm | Blue (0.4%) 5nm | Blue (5.2%) 25nm | ETL (LGD) 20nm | LiF/Al 0.5nm/100nm |

ORGANIC LIGHT EMITTING DEVICE AND METHOD FOR MANUFACTURING THE SAME

This application claims the benefit of Korean Patent Application No. 10-2011-0146883, filed on Dec. 30, 2011, which is hereby incorporated by reference as if fully set forth herein.

BACKGROUND OF THE INVENTION

1. Field of the Invention

The present invention relates to an organic light emitting device, and more particularly, to an organic light emitting device, efficacy and lifetime of which are improved by forming a blue light emitting layer disposed over respective pixels in common as a double layer structure, and thus exhibits improved and a method for manufacturing the same.

2. Discussion of the Related Art

An image display device displaying a variety of information on a screen is being developed toward thinner, lighter, portable and higher-function trends as a core technology of screen info-communication age. In this regard, as flat panel display devices capable of solving high weight and high volume which are drawbacks of cathode-ray tubes (CRTs), organic light emitting displays which display images while controlling an amount of light emitted from an organic light emitting layer attract much attention.

Organic light emitting displays spontaneously emit light using a thin light emitting layer disposed between electrodes, thus advantageously enabling realization of a thin film like paper. Such an organic light emitting display is divided into an active matrix-type that can be selectively operated by cell drivers provided in respective pixels and a passive matrix-type that can be controlled according to respective lines.

Active matrix organic light emitting displays (AMOLED) display an image through pixels including three color (R, G, B) pixel groups arrayed in a matrix form. Each pixel includes an organic light emitting device such as an organic light emitting diode and a cell driver driving the organic light emitting diode. The cell driver includes a gate line to supply a scan signal, a data line to supply a video data signal, and at least two thin film transistors between common power lines to supply a common power signal and drive an anode of the organic light emitting diode.

The organic light emitting device includes an anode, a hole injection layer (HIL), a hole transport layer (HTL), a light emitting layer, an electron transport layer (ETL), an electron injection layer (EIL), and a cathode.

Such an organic light emitting device is generally known to be formed by separately vacuum-depositing (evaporating) respective layers. In accordance with vacuum deposition, materials for layers to be formed are deposited in a gas state in a vacuum chamber on a substrate.

In this regard, when a vacuum chamber is used, the size of the vacuum chamber should be at least larger than that of the substrate upon which vacuum deposition is performed, and the vacuum chamber has a difficulty in securing a sufficient space of width and length enabling introduction of the substrate into the chamber, thus having a limitation of increase in size and, if possible, it is difficult to maintain the size-increased chamber under vacuum. For this reason, other methods for manufacturing organic light emitting devices have been considered.

For example, a method of forming layers in a solution state on a substrate through a solution process, without using a chamber requiring additional vacuum conditions is suggested.

However, a part of layers constituting the organic light emitting device have poor stability due to inherent characteristics of materials thereof, thus being disadvantageously unsuitable for the solution process. In particular, when a blue light emitting material is used for formation of light emitting layer through the solution process and is then applied to displays, sufficient characteristics cannot be obtained. Accordingly, in recent years, a method of separately forming a blue light emitting layer and a green light emitting layer has been suggested. Such a conventional organic light emitting device has the following disadvantages.

In recent years, a hybrid-type organic light emitting device having a structure in which a red light emitting layer and a green light emitting layers are separately formed in each pixel and a blue light emitting layers is formed throughout the pixels in common has been known.

However, since, in this structure, the blue light emitting layer is formed throughout the pixels, there are regions where the red light emitting layer overlaps the green light emitting layer and, in these regions, color purity is disadvantageously decreased due to color mixing of emitting light.

In addition, the blue light emitting layer has disadvantages of low stability and thus efficiency, as compared to other color light emitting layers due to inherent characteristics of material constituting the blue light emitting layer. In this case, in a hydride structure, the thickness of the blue light emitting layer should be reduced when a driving voltage is reduced. However, excitons are diffused into adjacent layers due to decrease in recombination region in the blue light emitting layer, and interface damage thus readily occurs on the contact interface.

In order to reduce the color purity, various structures have been suggested. However, these structures have a problem in that a driving voltage is increased, when color purity is improved. Hybrid organic light emitting devices having a structure capable of improving color purity, while reducing a driving voltage have not yet been developed.

Also, there is a demand for application of solution processes to hybrid devices, but layers unsuitable for solution processes due to inherent limitations of materials are present and, for this reason, there is a difficulty in stably applying a solution process to a plurality of layers due to damage to the surface of layers formed by a solution process when the solution process is used in conjunction with vacuum deposition (evaporation).

SUMMARY OF THE INVENTION

Accordingly, the present invention is directed to an organic light emitting device and a method for manufacturing the same that substantially obviate one or more problems due to limitations and disadvantages of the related art.

An object of the present invention is to provide an organic light emitting device, efficacy and lifetime of which are improved by forming a blue light emitting layer disposed over respective pixels in common as a double layer structure, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device includes: a substrate divided into and defined by first to third pixels; a first electrode disposed on the substrate and a second electrode facing the first electrode, the second electrode being spaced from the first electrode; a first light emitting layer and a second light emitting layer disposed in the first pixel and in the second pixel, respectively, between the first electrode and the second electrode; a sub-light emitting layer and a third light emitting layer disposed over the first to third pixels in this order on the first light emitting layer and the second light emitting layer; a first common layer disposed between a layer including the first light emitting layer and the second light emitting layer, and the first electrode; and a second common layer disposed between the third light emitting layer and the second electrode.

The sub-light emitting layer and the third light emitting layer may contain a dopant representing light with the same color.

A hole mobility of a host material contained in the sub-light emitting layer may be higher than a hole mobility of a host material contained in the third light emitting layer.

The host material of the sub-light emitting layer may have a triplet energy level of 2.7 eV of more.

The host material contained in the sub-light emitting layer may have a hole mobility of $1.0 \times 10^{-7}$ cm$^2$/s·V or more and an electron mobility of $1.0 \times 10^{-7}$ cm$^2$/s·V or more.

LUMO and HOMO energy levels of the host material contained in the sub-light emitting layer are different within 0.5 eV or less from LUMO and HOMO energy levels of the host material contained in the third light emitting layer, respectively.

The dopant may be contained in the sub-light emitting layer in an amount lower than 0.5%, based on an amount of the host material contained therein. The dopant may be contained in the third light emitting layer in an amount of 4 to 6%, based on an amount of the host material contained therein.

The first light emitting layer may be a red light emitting layer, the second light emitting layer may be a green light emitting layer and the third light emitting layer may be a blue light emitting layer.

The first common layer, the first light emitting layer and the second light emitting layer may be formed of a soluble material, and the sub-light emitting layer, the third light emitting layer and the second common layer may be formed of a small molecules organic material.

The substrate may include a thin film transistor array including a thin film transistor connected to the first electrode in each pixel.

In accordance with another aspect of the present invention, provided is a method for manufacturing an organic light emitting device including: preparing a substrate divided into and defined by first to third pixels; forming a first electrode on the substrate; forming a first common layer on the first electrode through a solution process; forming a first light emitting layer and a second light emitting layer in the first pixel and in the second pixel, respectively, on the first common layer, through a solution process; sequentially forming a sub-light emitting layer, a third light emitting layer and a second common layer over the first to third pixels through an evaporation process such that they cover the first light emitting layer and the second light emitting layer; and forming a second electrode on the second common layer.

The solution process used for formation of the first common layer, the first light emitting layer and the second light emitting layer may be selected from inkjet printing, nozzle printing, transfer, slit coating, gravure printing and thermal jet printing.

The formation of the sub-light emitting layer, the third light emitting layer and the second common layer may be carried out by sequentially depositing small molecules organic materials constituting the respective layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings:

FIG. 6 is a view illustrating detailed configurations of red pixels in an organic light emitting device of the present invention and first and second reference examples; and FIG. 7 is a view illustrating detailed configurations of green pixels in an organic light emitting device of the present invention and first and second reference examples; and FIG. 8 is a view illustrating detailed configurations of blue pixels in an organic light emitting device according to the present invention and a first reference example.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting device and a method for manufacturing the same according to the present invention will be described in detail with reference to the annexed drawings.

Figure 1:
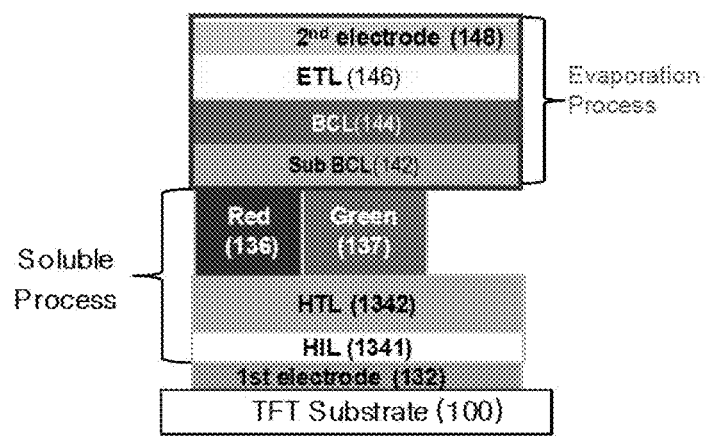
FIG. 1 is a sectional view illustrating an organic light emitting device according to the present invention.

FIG. 1 is a sectional view illustrating an organic light emitting device according to the present invention.

As shown in FIG. 1, the organic light emitting device includes a TFT substrate 100 divided into and defined by first to third pixels, a first electrode 132 disposed on the TFT substrate, a second electrode 148 facing the first electrode 132 while the second electrode 148 is spaced from the first electrode 132, a first light emitting layer 136 disposed in the first pixel provided between the first electrode 132 and the second electrode 148, a second light emitting layer 137 disposed in the second pixel, a sub-light emitting layer (TCL) 142 and a third light emitting layer 144 sequentially disposed in the first to third pixels on the first light emitting layer 136 and the second light emitting layer 137, a first common layer 134 disposed between the layers of the first light emitting layer 136 and the second light emitting layer 137, and the first electrode 132, and a second common layer 146 disposed between the third light emitting layer 144 and the second electrode 148.

Here, the TFT substrate 100 is provided with cell drivers, each including a thin film transistor (TFT), to independently drive respective pixels.

Also, the first to third pixels are formed to be regularly repeated. This regularity may be realized according to lines or diagonal lines.

Also, in the illustrated example, the first pixel is a red pixel, the second pixel is a green pixel and the third pixel is a blue pixel. The red light emitting layer and the green light emitting layer are formed in the corresponding pixel and the blue light emitting layer is formed over all the pixels in common. Also, such a structure in which the light emitting layers overlap in a vertical structure is referred to as a "hybrid device".

However, in the organic light emitting device according to the present invention, combination of other colors may be changed without limitation to this color combination so long as white can be realized by mixing colors of respective light emitting layers. For example, the third pixel may be changed into a blue pixel, and the first and second pixels may be changed into yellow and green pixels, respectively.

Meanwhile, the first light emitting layer 136 and the second light emitting layer 137 are separately formed in different pixels. These layers are formed by selectively coating the first common layer 134 with a high- or low-molecular material suitable for a solution process. Here, materials constituting the first light emitting layer 136 and the second light emitting layer 137 formed by the solution process may be fluorescent or phosphorescent materials. These light emitting layers 136 and 137 include one or more dopants rendering color of emitting light included in one or more hosts.

Theoretically, phosphorescence has an about three-time higher efficiency, as compared to fluorescence. Phosphorescent or fluorescent materials included in the light emitting layers may be selected in consideration of a level of color mixing with other light emitting layers and lifetime.

Here, for example, the solution process may be selected from inkjet printing, nozzle printing, a transfer process and thermal jet printing. Such a solution process may be carried out on the substrate without using an additional mask or chamber.

Of the afore-mentioned light emitting layers, only the third light emitting layer (blue light emitting layer) is formed by depositing a low molecular material on the substrate. The reason for this is that a material for the blue light emitting layer known to date has an insufficient efficiency and low stability, as compared to other light emitting layers. If a material for the blue light emitting layer capable of exhibiting superior efficiency and improved stability even through the solution process has been developed, the blue light emitting layer may also be formed even through the solution process.

In the illustrated organic light emitting device, the third light emitting layer 144 is formed as the blue light emitting layer by deposition using a small molecules material, and the sub-light emitting layer 142 and the second electrode 148 having the same dopant are formed by vacuum deposition.

In this case, by forming the sub-light emitting layer 142 and the third light emitting layer 144 by vacuum deposition, without greatly increasing the third light emitting layer (blue light emitting layer in the illustrated example), a zone where holes transported from red and green light emitting layers recombine with electrons transported from the second common layer 146 are confined by the third light emitting layer 144 and luminous properties can be thus optimized. As a result, in particular, efficacy and lifetime of blue light can be improved in spite of unstable material properties of the light emitting layer.

Here, the sub-light emitting layer 142 disposed on the bottom of the third light emitting layer 144 has an electron mobility of $1.0 \times 10^{-7}$ cm$^2$/s·V or more and a hole mobility of $1.0 \times 10^{-7}$ cm$^2$/s·V or more, thus having bipolar properties having high hole mobility as well as high electron mobility. Also, the sub-light emitting layer 142 contains a small amount of dopant having the same color as the third light emitting layer 144 over all the pixels in common.

Also, a host material of the sub-light emitting layer 142 has a triplet energy level of 2.7 eV or more.

In this case, preferably, LUMO and HOMO energy levels of the host material contained in the sub-light emitting layer are different within 0.5 eV or less from LUMO and HOMO energy levels of the host material contained in the third light emitting layer, respectively.

That is, in order to facilitate transport of holes between the first and second light emitting layers 136 and 137, and the third light emitting layer 144 which are formed as different layers, the sub-light emitting layer 142 has an absolute value of HOMO energy level which is 0.5 eV or less smaller than absolute values of the HOMO energy levels of the first to third light emitting layers 136, 137 and 144. In order to facilitate transport of electrons, the sub-light emitting layer 142 has an absolute value of a LUMO energy level which is 0.5 eV or less higher than absolute values of the LUMO energy levels of the first to third light emitting layers 136, 137 and 144.

Here, the dopant is contained in the sub-light emitting layer 142 in an amount lower than 0.5%, based on the amount of the host contained therein. The dopant is contained in the third light emitting layer 144 in an amount of 4% to 6%, based on the amount of the host contained therein.

That is, the sub-light emitting layer 142 has a thickness of about 5 nm which is lower than that of the third light emitting layer 144 and contains a small amount of blue (or rendering third light emitting layer) dopant, but functions to stabilize interfacial properties and thus facilitate transport of holes and electrons to adjacent light emitting layers, instead of directly emitting light.

Meanwhile, the sub-light emitting layer 142 and the third light emitting layer 144 may be formed of a small molecules organic material, enabling application of vacuum deposition.

The sub-light emitting layer 142, the third light emitting layer 144 and the second common layer 146 are formed over all the pixels in common without division of regions, which are formed by vacuum deposition. These layers are formed over the entire surface of the substrate without using any mask and without division of regions.

Here, the first common layer 134, the first light emitting layer 136 and the second light emitting layer 137 are formed through a solution process using a soluble material.

The first common layer 134 includes a hole injection layer 1341 and a hole transport layer (HTL) 1342. If desired, the hole injection layer 1341 may be omitted, or may be formed as a single layer made of a mixture of a material for the hole transport layer and a material for the hole injection layer. Also, the hole injection layer 1341 and the hole transport layer 1342 may be formed as a plurality of layers including two or more layers. In all cases, the first common layer 134 functions to transport holes from the first electrode 132 to the first and second light emitting layers 136 and 137, and the sub-light emitting layer.

Meanwhile, although the sub-light emitting layer 142 and the third light emitting layer 144 are even, in an actual process, light emitting layers present in other pixels may extend to the blue pixel.

As shown in the drawing, the second common layer 146 may be formed as an electron transport layer including a single layer, or if desired, an electron injection layer may be further formed on the electron transport layer. In this case, the second common layer 146 functions to transport electrons from the second electrode 148 to the third light emitting layer 144.

Also, one of the first electrode 132 and the second electrode 148 is formed of a transparent electrode and the other is formed of a reflective electrode, thus defining a light emission direction. For example, when the first electrode 132 is formed of a transparent material such as ITO (indium tin oxide) and the second electrode 148 is formed of a reflective metal such as Al, bottom emission is realized. On the other hand, when the first electrode 143 includes a laminate including a reflective metal of Ag/ITO and the second electrode 148 includes a metal laminate of Mg:Ag with a thickness of 20 nm or less to provide transmittance, top emission may be realized.

Here, one of the first electrode 132 and the second electrode 148 may be patterned according to individual pixels and the patterned electrode is connected to the thin film transistor included in the cell driver of the TFT substrate to enable application of a voltage.

Hereinafter, an example in which the organic light emitting device according to the present invention is applied to an active matrix mode will be described.

Figure 2:
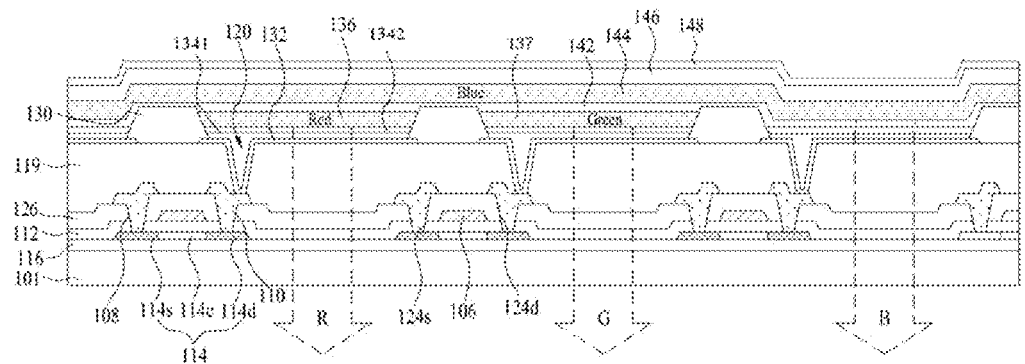
FIG. 2 is a sectional view illustrating a configuration of the organic light emitting device of FIG. 1 applied to an active matrix mode.

FIG. 2 is a sectional view illustrating a configuration of the organic light emitting device of FIG. 1 applied to an active-matrix mode.

In the example shown in FIG. 2, only a single pixel unit including red, green and blue pixels is shown. This pixel unit is consecutively disposed in plural in horizontal and vertical directions.

As shown in FIG. 2, the active-matrix organic light emitting display includes a TFT substrate 100 including a driving thin film transistor and an organic light emitting device connected to the driving thin film transistor.

The driving thin film transistor includes an active layer 114, a source electrode 108 and a drain electrode 110 connected to source/drain regions 114s and 114d, respectively, disposed at both sides of the active layer 114 and a gate electrode 106 that overlaps a channel region 114c of the active layer 114. Here, the source/drain regions 114s and 114d are doped with an n-type impurity.

Also, the TFT substrate 100 includes a buffer film 116 disposed on a substrate 101, a driving thin film transistor disposed in a predetermined region on the buffer film 116, and an organic insulating film 119 that makes the entire surface including the driving thin film transistor even.

Specifically, a configuration provided on the TFT substrate 100 will be described in detail.

A buffer film 116 is formed over the entire surface of the substrate 101 and an active layer 114 is formed in a predetermined region on the buffer film 116.

The gate electrode 106 overlaps the channel region 114c of the active layer via the gate insulating film 112. Also, the source electrode 108 and the drain electrode 110 are insulated from each other such that the gate electrode 106 and an interlayer insulating film 126 are interposed therebetween.

The source electrode 108 and the drain electrode 110 are connected to the source region 114s and the drain region 114d, respectively, of the active layer 114 doped with an n+ impurity via contact holes passing through the interlayer insulating film 126 and the gate insulating film 112.

The active layer 114 may further include a light dropped drain (LDD) region (not shown) doped with an n-impurity, interposed between the channel region 114c, and the source and drain regions 114s and 114d in order to reduce off current.

Also, the organic protective film 119 may be formed of double layers including an inorganic protective film made of an inorganic insulating material and an organic protective film made of an organic insulating material.

Also, the first electrode 132 is formed in each pixel such that it is connected to the drain electrode 110.

Meanwhile, a reference numeral "120" which is not shown represents a contact hole 120 formed on the organic protective film 119 to connect the first electrode 132 to the drain electrode 110.

The organic light emitting device includes a first electrode 132 connected to the drain electrode 110 of the driving thin film transistor, and includes the hole injection layer 1341 and the hole transport layer 1342 constituting the first common layer 134, the first light emitting layer (red light emitting layer) 136 formed in the red pixel (first pixel), the second light emitting layer (green light emitting layer) 137 formed in the green pixel, and the sub-light emitting layer 142, the third light emitting layer (blue light emitting layer) 144, the second common layer 146 formed over the entire surface of the substrate, and the second electrode 148 as shown in FIG. 1.

If desired, as shown in FIG. 2, a plurality of banks 130 may be further disposed between the hole injection layer 1341, the hole transport layer 1342 and the first and second light emitting layers 136 and 137, to divide the respective color pixels. In an example shown in FIG. 1, the bank 130 is omitted. However, banks to separate respective pixels are disposed in active matrix organic light emitting displays. However, the banks may be omitted according to the structure of light emitting displays.

When an electric field is formed between the first electrode 132 and the second electrode 148 through application of a voltage thereto, holes injected from the first electrode 132 and electrons injected from the second electrode recombine together in the first to third light emitting layers 136, 137 and 144, to produce excitons, which drop to a bottom state. At this time, the organic light emitting device realizes bottom emission of light.

Here, the sub-light emitting layer 142 controls charge balance between the first light emitting layer 136, the first layer of the second light emitting layer 137 and the second layer of the third light emitting layer 144, facilitates transport of electrons and holes to the light emitting layer and thereby enhances electron/hole recombination in the light emitting layer and improves luminous efficacy.

Hereinafter, an example of performing a solution process applied to the hole injection layer, the hole transport layer, the red light emitting layer and the green light emitting layer of the organic light emitting device will be described.

Figure 3A:
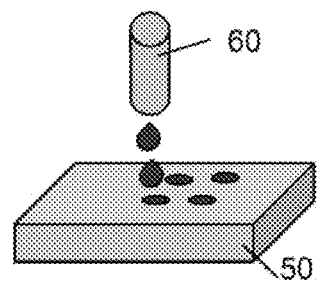
FIGS. 3A to 3C are views illustrating an example of a solution process of the organic light emitting device according to the present invention.
Figure 3B:
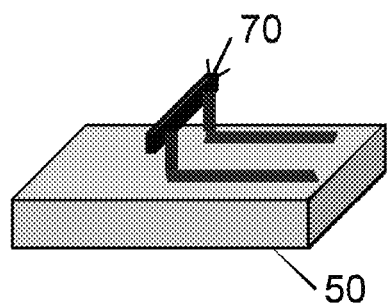
Figure 3C:
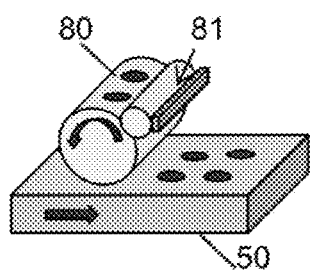

FIGS. 3A to 3C are views illustrating an example of a solution process of the organic light emitting device according to the present invention.

FIG. 3A illustrates inkjet printing which is performed through a head 60 having a plurality of injection holes capable of dropping dots on a substrate 50. In this case, during printing, the head 60 or the substrate 50 moves. Accordingly, fine control according to respective regions is possible. That is, selective dotting according to individual pixels in the organic light emitting device can be easily performed.

FIG. 3B illustrates nozzle printing which performs printing on the substrate 50 using a slit-shaped nozzle 70. Such a nozzle 70 may be provided in plural. Nozzle printing is suitable for printing patterns distributed in a wider region, as compared to inkjet printing. For example, in a case of an organic light emitting device provided with banks on the substrate, when predetermined layers are formed by an entire-surface nozzle printing method, regions can be divided via the banks.

FIG. 3C illustrates roll printing which is performed by rotating a patterned main roller 60 on a substrate 50 to form a printing pattern. In this case, an auxiliary roller 81 is connected to a head to which a printing solution is supplied, to induce continuous supply of the printing solution from the head to the pattern of the main roller 80. In some cases, when the main roller 80 is not patterned, application over the entire surface of the substrate 50 is possible.

As other examples of performing the solution process, there are transfer, gravure printing and thermal jet printing.

However, these examples are limiting examples of the solution process and other equipment according to development of equipment may be used, or the solution process may be carried out through other processes.

Hereinafter, the effects of the organic light emitting device according to the present invention demonstrated through testing will be described.

Figure 4:
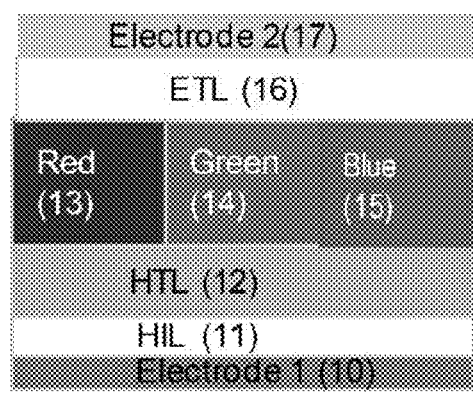
FIG. 4 is a sectional view illustrating a first reference example compared with the organic light emitting device of the present invention.

FIG. 4 is a sectional view illustrating a first reference example compared with an organic light emitting device of the present invention.

As shown in FIG. 4, in the first reference example, different light emitting layers are separately formed in individual pixels. Specifically, the first reference example does not include a sub-light emitting layer and includes a hole injection layer 11, a hole transport layer 12, light emitting layers 13, 14 and 15 and an electron transport layer 16 formed between an anode 10 and a cathode 17. Also, the light emitting layers 13, 14 and 15 are independently defined as the red light emitting layer 13, the green light emitting layer 14 and the blue light emitting layer 15 according to individual pixels.

Figure 5:
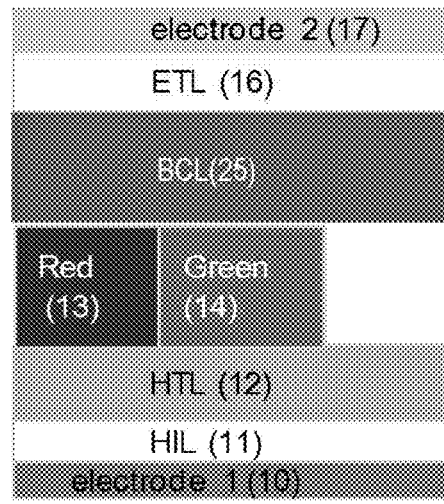
FIG. 5 is a sectional view illustrating a second reference example compared with the organic light emitting device of the present invention.

FIG. 5 is a sectional view illustrating a second reference example compared with an organic light emitting device of the present invention.

As shown in FIG. 5, in the second reference example, like a general hydride device, a blue light emitting layer 25 is formed over all the pixels in common and the blue light emitting layer 25 overlaps a red light emitting layer 13 in the red pixel and overlaps a green light emitting layer 14 in the green pixel.

The second reference example is different from the organic light emitting device of the present invention shown in FIG. 1, in that the second reference example does not include a sub-light emitting layer. A total thickness of the blue light emitting layer 25 corresponds to a total thickness of the sub-light emitting layer and the third light emitting layer of the organic light emitting device of the present invention.

After the reference examples shown in FIGS. 4 and 5 are prepared, luminance, luminous efficacy, driving voltage and color coordinates of red, green and blue light-emission pixels for the reference examples and the organic light emitting device of the present invention as shown in FIG. 1 are measured.

Here, the first and second reference examples and the organic light emitting device of the present invention include, in addition to the anode formed of a transparent material and the cathode formed of a reflective metal such as Al, a hole injection layer with a thickness of 40 nm, a hole transport layer with a thickness of 20 nm, a red light emitting layer with a thickness of 50 nm, a green light emitting layer with a thickness of 40 nm, a blue light emitting layer with a thickness of 25 nm, an electron transport layer with a thickness of 20 nm and an electron injection layer with a thickness of 0.5 nm in common. Meanwhile, the cathode formed to a thickness of 100 nm using Al is tested. Also, materials used for testing of the layers included in the reference example and the organic light emitting device of the present invention in common are identical. For example, PEDOT is used a material for the hole injection layer and LiF is used as a material for the electron injection layer. The first and second reference examples and the present invention are the same in terms of materials for the remaining layers, and the present invention is distinguished from reference examples in that the present invention includes the sub-light emitting layer and a thickness of the blue light emitting layer is changed.

FIG. 6 is a view illustrating detailed configurations of red pixels in an organic light emitting device of the present invention, and first and second reference examples.

As shown in FIG. 6, regarding a red pixel, a first reference example (Ref), in which only a red light emitting layer is included, a second reference example (Red1) in which a red light emitting and a single blue light emitting layer are laminated in this order, and an organic light emitting device of the present invention (Red2) in which a red light emitting layer, a sub-light emitting layer and a blue light emitting layer are laminated in this order are compared.

In the second reference example (Red1), the blue light emitting layer has a blue dopant content of 5.2% and a thickness of 30 nm, while in the organic light emitting device of the present invention (Red2), the sub light emitting layer has a blue dopant content of 0.4% and a thickness of 5 nm and the blue light emitting layer has a blue dopant content of 5.2% and a thickness of 25 nm.

As can be seen from Table 1, the reference example exhibits CIE color coordinate of (0.672, 0.321) which is substantially equivalent to that of pure red.

However, the second reference example (RED1) in which the red light emitting layer overlaps the blue light emitting layer in the red pixel, like a general hydride device, exhibits a luminance of 4.5 Cd/A, which is 0.1 Cd/A lower than that of the first reference example and a driving voltage of 7.9V, which is greatly higher than that of the first reference example. The second reference example (RED1) exhibits CIE coordinates (0.683, 0.316) slightly different from pure red. This means emission of red-like light.

On the other hand, when the sub-light emitting layer is disposed under the blue light emitting layer, like the organic light emitting device of the present invention, in the red pixel, a luminance is 5.2 Cd/A, a driving voltage is 7.5V and a color coordinate is (0.675, 0.322). This means that the present invention exhibits higher luminance and improved CIE coordinates increased than the first and second reference examples.

That is, these results mean that, even in a hybrid device structure in which the red light emitting layer overlaps the blue light emitting layer, luminous efficacy of the red light emitting layer can be improved and color mixing cannot be prevented by forming a sub-light emitting layer under the blue light emitting layer disposed in common according to individual pixels like the organic light emitting device of the present invention.

TABLE 1

| @1000 nit | Cd/A | V | CIE X | CIE Y |
|---|---|---|---|---|
| Ref | 4.6 | 7 | 0.672 | 0.321 |
| Red 1 | 4.5 | 7.9 | 0.683 | 0.316 |
| Red 2 | 5.2 | 7.5 | 0.675 | 0.322 |

FIG. 7 is a view illustrating detailed configurations of green pixels in an organic light emitting device of the present invention, and first and second reference examples.

As shown in FIG. 7, regarding a green pixel, a first reference example (Ref), in which only a green light emitting layer is included, a second reference example (Green1) in which a green light emitting and a single blue light emitting layer are laminated in this order, and an organic light emitting device of the present invention (Green2) in which a green light emitting layer, a sub-light emitting layer and a blue light emitting layer are laminated in this order are compared.

In the second reference example (Green1), the blue light emitting layer has a blue dopant content of 5.2% and a thickness of 30 nm, while in the organic light emitting device of the present invention (Green2), the sub light emitting layer has a blue dopant content of 0.4% and a thickness of 5 nm and the blue light emitting layer has a blue dopant content of 5.2% and a thickness of 25 nm.

As can be seen from Table 2, the reference example (Ref), in which different colors are independently rendered in individual pixels, exhibits CIE color coordinate of (0.333, 0.615) in the green pixel, which is substantially equivalent to that of pure green.

However, the second reference example (Green1) in which the green light emitting layer overlaps the blue light emitting layer in the green pixel, like a general hydride device, exhibits a luminance of 18 Cd/A which is 5.6 Cd/A lower than that of the first reference example and a driving voltage of 6.4V, which is 50% higher than the first reference example. The second reference example (Green1) exhibits CIE coordinate of (0.368, 0.603), which means shift in CIE coordinate in a case of green.

On the other hand, when the sub-light emitting layer is disposed under the blue light emitting layer, like the organic light emitting device of the present invention, in the red pixel, a luminance is 25 Cd/A, a driving voltage is 5.2V, and color coordinate is (0.332, 0.621). This means that the present invention exhibits higher luminance and improved CIE coordinates than the first and second reference examples. Such an organic light emitting device of the present invention emits light with pure green-like color, as compared to the first reference example in which light emitting layers are independently formed in individual pixels, thus increasing an exciton confinement function of the sub-light emitting layer to the respective light emitting layers.

That is, these results mean that, even in a hybrid device structure in which the green light emitting layer overlaps the blue light emitting layer, luminous efficacy of the green light emitting layer can be improved and color mixing cannot be prevented by forming a sub-light emitting layer under the blue light emitting layer disposed in common according to individual pixels like the organic light emitting device of the present invention.

TABLE 2

| @1000 nit | Cd/A | V | CIE X | CIE Y |
|---|---|---|---|---|
| Ref | 23.6 | 4.4 | 0.333 | 0.615 |
| Green 1 | 18 | 6.4 | 0.368 | 0.603 |
| Green 2 | 25 | 5.2 | 0.332 | 0.621 |

FIG. 8 is a view illustrating detailed configurations of blue pixels in an organic light emitting device of the present invention and a first reference example.

As shown in FIG. 8, regarding a blue pixel, a first reference example (Ref), in which only a blue light emitting layer is included, and a second reference example (Blue1) in which a sub-light emitting layer and a blue light emitting layer are laminated in this order are compared.

In the first reference example (Ref), the blue light emitting layer has a blue dopant content of 5.2% and a thickness of 25 nm, while in the organic light emitting device of the present invention (Blue1), the sub light emitting layer has a blue dopant content of 0.4% and a thickness of 5 nm and the blue light emitting layer has a blue dopant content of 5.2% and a thickness of 25 nm.

As can be seen from Table 3, the first reference example (Ref) in which different colors are independently realized in individual pixels exhibits a luminous efficacy of 5.1 Cd/A, a driving voltage of 4.4V and CIE color coordinate of (0.14, 0.10) rendering blue.

On the other hand, when the sub-light emitting layer is disposed under the blue light emitting layer, like the organic light emitting device of the present invention (blue1), in the green pixel, a luminance is 6.0 Cd/A, a driving voltage is 4.6 V and a color coordinate is (0.14, 0.10). In particular, this means that the present invention exhibits considerably higher luminance than the first reference example (Ref). Both the reference example and the present invention include only the blue light emitting layer in the blue pixel and thus exhibit the same CIE color coordinate. Here, in the blue pixel of the organic light emitting layer of the present invention, driving voltage is slightly increased and luminous efficacy is slightly improved.

TABLE 3

| @1000 nit | Cd/A | V | CIE X | CIE Y |
|---|---|---|---|---|
| Ref | 5.1 | 4.4 | 0.14 | 0.10 |
| Blue 1 | 6.0 | 4.6 | 0.14 | 0.10 |

That is, these results mean that, even in a hybrid device structure in which the red or green light emitting layer overlaps the green light emitting layer, luminous efficacy of the respective light emitting layers can be improved and color mixing cannot be prevented by forming a sub-light emitting layer under the blue light emitting layer disposed in common according to individual pixels, like the organic light emitting device of the present invention. Also, through improvement in efficacy of the blue light emitting layer, high luminous efficacy can be obtained, as compared to a structure including the only the blue light emitting layer. Through improvement in efficacy of the blue light emitting layer which has efficacy lower than other light emitting layers, lifetime of a hybrid device in which the blue light emitting layer overlaps other light emitting layers can be improved.

Hereinafter, a method for manufacturing the organic light emitting device of the present invention will be described in brief with reference to FIG. 1.

First, a TFT substrate 100 in which first to third pixels are disposed in a matrix form in this order is prepared. Here, the TFT substrate 100 includes a thin film transistor at each pixel.

Then, a first electrode 132 is formed on the substrate 100. The first electrode 132 is connected to the thin film transistor in each pixel.

Then, a first common layer 134 is formed on the first electrode 132 through a solution process.

Then, a first light emitting layer 136 and a second light emitting layer 137 are formed in the first pixel and in the second pixel, respectively, on the first common layer 134 through a solution process.

Then, a sub-light emitting layer 142, a third light emitting layer 144, and a second common layer 146 are sequentially formed over the first to third pixels through an evaporation process such that these layers cover the first light emitting layer 136 and the second light emitting layer 137.

Here, the sub-light emitting layer 142 and the third light emitting layer 144 contain dopants rendering light with the same color, and amounts of dopants of the sub-light emitting layer 142 and the third light emitting layer 144 are lower than 0.5%, and 4% to 6%, respectively, based on the amount of hosts contained in the respective layers.

Then, a second electrode 148 is formed on the second common layer 146.

As such, according to the method for manufacturing the organic light emitting device of the present invention, the hybrid organic light emitting device fabricated through a combination of solution and deposition (evaporation) processes is used, and a sub-light emitting layer 142 is formed on the top and bottom of the third light emitting layer (blue light emitting layer) formed in respective pixels in common, thus confining excitons in the respective light emitting layers, thereby improving luminous efficacy and preventing color mixing of light emitting layer overlap regions.

As apparent from the fore-going, the organic light emitting device and the method of manufacturing the same according to the present invention have the following advantages.

First, since the red light emitting layer and the green light emitting layer are formed in the corresponding pixels through a solution method and a sub-light emitting layer and a blue light emitting layer are then sequentially formed by vacuum deposition, an optimal thickness of hole/electron recombination zone capable of maximizing a blue luminous efficacy can be obtained without greatly increasing the thickness of the blue light emitting layer due to presence of the sub-light emitting layer.

Second, direct contact between the red and green light emitting layers formed through a solution process, and the blue light emitting layer formed by a vacuum deposition process is avoided and interface contact between the red light emitting layer and the green light emitting layer can be improved via the sub-light emitting layer. Also, introduction of holes and electrons into respective light emitting layers is facilitated and excitons can be thus confined in the respective light emitting layers by using the same dopant as the blue light emitting layer for the sub-light emitting layer and imparting bipolarity to the light emitting layer.

Third, lifetime of the blue light emitting layer is increased, as compared to other light emitting layers and lifetime of the device can be thus improved.

Fourth, although a region where a red or green light emitting layer overlaps a blue light emitting layer exists in a hybrid device structure, color mixing of this overlapping region is prevented and color purity can thus be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
 a substrate divided into and defined by first to third pixels;
 a first electrode disposed on the substrate and a second electrode facing the first electrode, the second electrode being spaced from the first electrode;
 a first light emitting layer and a second light emitting layer disposed in the first pixel and in the second pixel, respectively, between the first electrode and the second electrode;
 a sub-light emitting layer and a third light emitting layer disposed over the first to third pixels in this order, on the first light emitting layer and the second light emitting layer;
 a first common layer disposed between a layer including the first light emitting layer and the second light emitting layer, and the first electrode; and
 a second common layer disposed between the third light emitting layer and the second electrode.

2. The organic light emitting device according to claim 1, wherein the sub-light emitting layer and the third light emitting layer contain a dopant representing light with the same color.

3. The organic light emitting device according to claim 2, wherein a hole mobility of a host material contained in the sub-light emitting layer is higher than a hole mobility of a host material contained in the third light emitting layer.

4. The organic light emitting device according to claim 2, wherein the host material of the sub-light emitting layer has a triplet energy level of 2.7 eV of more.

5. The organic light emitting device according to claim 2, wherein the host material contained in the sub-light emitting layer has a hole mobility of $1.0 \times 10^{-7}$ cm$^2$/s·V or more and an electron mobility of $1.0 \times 10^{-7}$ cm$^2$/s·V or more.

6. The organic light emitting device according to claim 2, wherein LUMO and HOMO energy levels of the host material contained in the sub-light emitting layer are different within 0.5 eV or less from LUMO and HOMO energy levels of the host material contained in the third light emitting layer, respectively.

7. The organic light emitting device according to claim 2, wherein the dopant is contained in the sub-light emitting layer in an amount lower than 0.5%, based on an amount of the host material contained therein.

8. The organic light emitting device according to claim 7, wherein the dopant is contained in the third light emitting layer in an amount of 4 to 6%, based on an amount of the host material contained therein.

9. The organic light emitting device according to claim 1, wherein the first light emitting layer is a red light emitting layer, the second light emitting layer is a green light emitting layer and the third light emitting layer is a blue light emitting layer.

10. The organic light emitting device according to claim 1, wherein the first common layer, the first light emitting layer and the second light emitting layer are formed of a soluble material.

11. The organic light emitting device according to claim 10, wherein the sub-light emitting layer, the third light emitting layer and the second common layer are formed of a small molecules organic material.

12. The organic light emitting device according to claim 1, wherein the substrate comprises a thin film transistor array including a thin film transistor connected to the first electrode in each pixel.

13. A method for manufacturing an organic light emitting device comprising:
preparing a substrate divided into and defined by first to third pixels;
forming a first electrode on the substrate;
forming a first common layer on the first electrode through a solution process;
forming a first light emitting layer and a second light emitting layer in the first pixel and in the second pixel, respectively, on the first common layer, through a solution process;
sequentially forming a sub-light emitting layer, a third light emitting layer and a second common layer over the first to third pixels through an evaporation process such that they cover the first light emitting layer and the second light emitting layer; and
forming a second electrode on the second common layer.

14. The method according to claim 13, wherein the solution process used for formation of the first common layer, the first light emitting layer and the second light emitting layer is selected from inkjet printing, nozzle printing, transfer, slit coating, gravure printing and thermal jet printing.

15. The method according to claim 13, wherein the formation of the sub-light emitting layer, the third light emitting layer and the second common layer is carried out by sequentially depositing small molecules organic materials constituting the respective layers.

16. The method according to claim 13, wherein the sub-light emitting layer and the third light emitting layer contain a dopant representing light with the same color, and
amounts of the dopants contained in the sub-light emitting layer and the third light emitting layer are lower than 0.5% and an amount of 4 to 6%, respectively, based on amounts of host materials contained therein.

17. The method according to claim 13, wherein a hole mobility of the host material contained in the sub-light emitting layer is higher than a hole mobility of the host material contained in the third light emitting layer.

18. The method according to claim 13, wherein the first light emitting layer is a red light emitting layer, the second light emitting layer is a green light emitting layer and the third light emitting layer is a blue light emitting layer.

* * * * *